(12) United States Patent
Rosen

(10) Patent No.: US 7,145,110 B1
(45) Date of Patent: Dec. 5, 2006

(54) THERMAL BARRIER FOR A THERMISTOR

(76) Inventor: Howard Rosen, Lyncroft Road, Hampstead, Quebec (CA) H3X 3E3

( * ) Notice: Subject to any disclaimer, the term of this patent is extended or adjusted under 35 U.S.C. 154(b) by 0 days.

(21) Appl. No.: 11/254,078

(22) Filed: Oct. 19, 2005

(51) Int. Cl.
*H05B 1/02* (2006.01)

(52) U.S. Cl. ............ 219/492; 219/209; 219/210; 219/497; 219/506; 374/102

(58) Field of Classification Search .......... 219/492, 219/494, 497, 499, 501, 506, 413, 483, 481; 307/117; 236/47, 94; 338/25–30; 374/102, 374/120, 121
See application file for complete search history.

(56) References Cited

U.S. PATENT DOCUMENTS

| | | | | |
|---|---|---|---|---|
| 3,919,680 A | * | 11/1975 | Ueno et al. ............ | 338/28 |
| 4,492,948 A | * | 1/1985 | Clayton et al. ........ | 338/25 |
| 5,505,377 A | * | 4/1996 | Weiss .................... | 236/47 |
| 5,815,064 A | * | 9/1998 | Holmgren et al. ..... | 338/28 |
| 5,864,282 A | * | 1/1999 | Hannigan et al. ..... | 338/30 |
| 6,057,074 A | | 5/2000 | Matsuda et al. | |
| 6,836,409 B1 | | 12/2004 | Duxbury et al. | |
| 2005/0103877 A1 | * | 5/2005 | DeLuca ................. | 236/94 |
| 2006/0006244 A1 | * | 1/2006 | Morrow et al. ........ | 236/1 C |

FOREIGN PATENT DOCUMENTS

| | | | |
|---|---|---|---|
| JP | 407229777 A | * | 8/1995 |
| JP | 410216100 A | * | 8/1998 |

\* cited by examiner

*Primary Examiner*—Mark Paschall
(74) *Attorney, Agent, or Firm*—Hankin Patent Law; Marc E. Hankin

(57) ABSTRACT

The present invention is a an effective thermal barrier between the thermistor and higher temperature solids or electrical components in a thermostat or its equivalent device. The invention thermal barrier substantially reduces or essentially eliminates undesired conductive heating of the thermistor from support means or other electrical components.

12 Claims, 2 Drawing Sheets

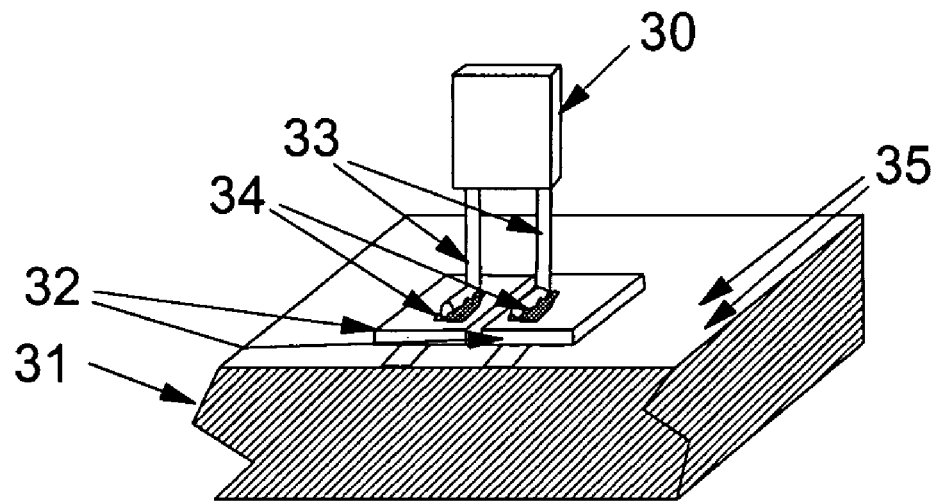
FIG. 2 - PRIOR ART
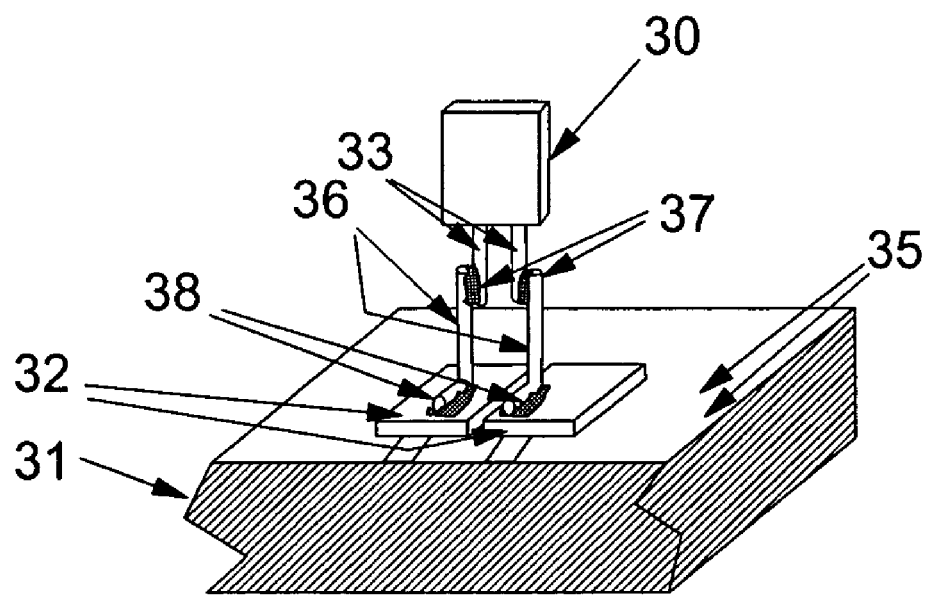
FIG. 3

THERMAL BARRIER FOR A THERMISTOR

FIELD OF THE INVENTION

This invention relates to the art of thermostats and, more particularly, to a thermostat incorporating an environmental temperature sensing device connected by conductor to local electrical circuits.

BACKGROUND OF THE INVENTION

Thermostats have been used for many years as a temperature sensitive switch which controls heating and/or cooling equipment for conditioning a space in which the thermostat, or a temperature sensor connected to the thermostat, is placed. In the well known manner, a simple thermostat can be adjusted to establish a temperature set point such that, when the sensed temperature in the conditioned space reaches the set point, the thermostat interacts with the heating and/or cooling equipment to take suitable action to heat or cool the conditioned space as may be appropriate for the season.

Modern thermostat systems, which take advantage of the ongoing rapid advances in electronic technology and circuit integration, have many features which provide more precise supervision of the heating and/or cooling equipment to achieve more economical and more comfortable management of the temperature of a conditioned space. Many modern thermostat systems include a real time clock, a memory and a data processor to run a process control program stored in the memory to accurately measure the temperature of a temperature sensor disposed in the conditioned space and to send control signals to the heating and/or cooling equipment to closely control the temperature of the conditioned space. Modern thermostat systems can incorporate algorithms in their control program to anticipate and minimize hysterisis or overshoot of the temperature in the conditioned space.

Many modern thermostat systems have a central control device or unit that receives environmental sensor data from one or more local sensors. These sensors are local in the sense that they are connected by short wire or are soldered by printed circuit board connection to other electrical components in the programmable thermostat. These sensors can detect temperature, humidity, or other parameters that may be used in a control program by the central control device to control environmental control equipment. The environmental control equipment (comprising HVAC equipment, among others) responds to signals from the central control device to affect the ambient comfort in rooms of a conditioned space. Typically, a local sensor signal is received by the central control device and its value compared with that of a pre-set setpoint. If the sensor value is sufficiently different from the setpoint, environmental control equipment is activated or de-activated in response thereto.

One well known temperature sensor used as a local temperature sensor is the resistance temperature detector (RTD), or thermistor. The thermistor is used to provide a signal voltage that changes as a function of the change in resistance of the temperature sensor. Negative temperature coefficient thermistors are typically made from a thin coil of semiconducting material such as a sintered metal oxide. Increasing temperature of a semiconductor increases the number of electrons promoted into the conducting band. Positive temperature coefficient thermistors are of the "switching" type, which means that their resistance rises suddenly at a certain critical temperature. The devices can be made of a doped polycrystalline ceramic containing barium titanate and other compounds or from a polymer with carbon grains embedded in it.

The typical thermistor comprises a pair of relatively rigid wires joined at one end to the resistive element. The two other wire ends are free for connection with the thermostat. Those free ends of the thermistor in prior art thermostats are usually soldered to support holes in a printed circuit board. The resulting structure provides a very secure support connection for the thermistor to the circuit board as well as a reliable electrical connection with other electrical components of the thermostat.

A desired design goal in programmable thermostats has been to reduce their size and/or incorporate additional electrical components to add to the functions of the thermostat. For protection of those components and to meet required aesthetic external features, these thermostats have a rigid housing that is adapted to be wall mounted. The housing provides openings for access to user interface features such as push buttons and a liquid crystal display screen. Making thermostats with a small housing is desirable because they are usually prominently wall mounted and might be unsightly if too large. Reduction of overall device size is accomplished in part by increasing the density of components in the device. However, increasing component density results in an increase in the density of energy that must be dissipated from the device as heat.

Consider the following example of heat generation in the housing of a modern thermostat. Relays for actuation of environmental control equipment such as heaters and air conditioners have often been located within the thermostat housing. These relays can be either non-latching or latching in well known examples in the prior art. The non-latching relays generate substantial heat as compared with latching relays in these applications. Non-latching relays are becoming more widely used for programmable thermostats. The more crowded thermostat housing will be unlikely to provide adequate ventilation to effectively remove this generated heat.

Once again consider the thermistor in the modern thermostat. Vents or openings are formed in the housing so that ambient air contacts the thermistor. The thermistor must be in continuous contact with a flow of ambient air so that the most accurate value for ambient air temperature is obtained. Although ambient air is allowed to flow over the thermistor, the temperature sensed by the thermistor for use by the thermostat control program and the temperature of ambient air are often significantly different. The thermistor can absorb heat by conduction or convection from electrical components within the thermostat housing. The sensed temperature of the thermistor in this case is higher than that of the ambient air. This causes the thermostat to operate environmental control equipment in error. Air conditioning equipment operates too much and heating equipment operates not enough.

The present inventor has found that the thermistor in modern thermostats absorbs heat by conduction from other electrical components through their common metallic electrical connections and through common mounting on a printed circuit board. The well known printed circuit board comprises a highly efficient heat transfer material in the glass fill used for its manufacture. While the glass fill provides exceptional support in a thin layer, electrical components mounted to such a board will absorb heat by conduction from remotely mounted heat sources. These heat sources can be other power dissipating components mounted on the same circuit board or can be other heat emitting surfaces exposed to the circuit board. Heat may be transferred to the circuit board by radiation or conduction.

Limited techniques are available for dissipating heat from components in high-density component operation. For example, fans may be employed to increase the flow of air across the surface of heated devices and components. Further, heat sinks may absorb dissipated heat and increase the surface area over which that heat may be dissipated.

However, these techniques are of little value in a modern day thermostat. Excessive cost and limited space for these components make them economically unavailable to reduce heat transfer to a thermistor locally mounted in a thermostat housing.

There is a need for a thermostat system where thermal isolation can be achieved for a thermistor locally mounted in a thermostat housing.

SUMMARY OF THE INVENTION

A thermostat system according to the invention includes:
a central control device having a processor (said processor having: a CPU, real time clock and a memory for storing a control program and data information);
a housing generally enclosing electrical components;
support means for supporting said electrical components in the housing;
connection means for connection of said electrical components;
multiple rooms comprising a conditioned space; and
environmental control equipment.

The central control device in a preferred embodiment is a programmable thermostat with a liquid crystal display and pressure sensitive buttons, both connected with the processor via an input/output unit. A circuit board for mounting and connecting electrical components is part of the support means of the thermostat, which circuit board in turn is secured to the thermostat housing.

The electrical components include a thermistor locally mounted on the support means and connected with other electrical components. The thermistor provides the control program with signals indicating local, ambient temperature for comparison with a setpoint for the environmental control equipment. Some electrical components may operate to generate heat which is transferred by conduction, radiation and convection to other electrical components in the thermostat. Most such heat transfer from higher temperature components to lower temperature components is made by conduction, i.e., through one or more solids that form a path between such components.

The invention further includes an effective thermal barrier between the thermistor and higher temperature solids or electrical components in a thermostat or its equivalent device. The invention thermal barrier substantially reduces or essentially eliminates undesired conductive heating of the thermistor from support means or other electrical components.

The thermal barrier in a preferred form comprises one or more sections of conductive metallic materials supporting a thermistor apart from support means and electrical components in a thermostat housing. It is known to extend the length of copper lead wires to attempt to provide thermal isolation for a thermistor in a thermostatic control device. Copper is so highly conductive that such length-dependent isolation is unlikely to be effective. The invention thermal barrier is made of a metallic conductor which does not require long sections of wire materials for thermal isolation of the thermistor.

The invention thermal barrier comprises relatively short and lightweight sections of electrically conductive, metallic material. Modern thermostats typically surface mount thermistors to a circuit board by soldered support and electrical connection. Lead, tin, copper, zinc, and other materials in solder thereby secure copper lead wires of a thermistor to the circuit board, all of which materials are excellent conductors of electricity and heat. High-end consumer and industrial circuit board substrates are typically made of a woven fiberglass mat impregnated with a flame resistant epoxy resin.

In one embodiment of the invention, a thermistor comprises a resistive element supported from and connected to two copper lead wires. To each of the free ends of the copper lead wires is soldered an end of a short length of thermal barrier wire. Two free ends of the thermal barrier wires are then surface mounted to a circuit board in a well known manner to electrically and supportively connect the thermistor to the circuit board. The thermal barrier wire supports the thermistor apart from direct physical contact with the soldered connection to the circuit board and conductive heat transfer from other electrical components.

In another embodiment, the thermistor comprises a resistive element supported from and connected to thermal barrier wires and then connected with the circuit board and electrical connections as described above.

The thermal barrier composition is chosen from metals or alloys thereof having relatively low heat transfer coefficients or thermal conductivities as compared prior art thermostat support and connector means. Exemplary of these metals (from which alloys may be formed) are the following:
(A) tin;
(B) antimony;
(C) bismuth;
(D) cadmium;
(E) chromium;
(F) hastelloy;
(G) inconel;
(H) titanium;
(I) manganese; and
(J) nickel or any other electrically conductive material which exhibits a high thermal resistance.

BRIEF DESCRIPTION OF THE DRAWINGS

FIG. 2 is a perspective view of a prior art thermistor electrically and supportively connected with a circuit board.

FIG. 3 is a perspective view of a thermistor electrically and supportively connected with a circuit board via the invention thermal barrier wires.

DETAILED DESCRIPTION OF THE INVENTION

Figure 1:
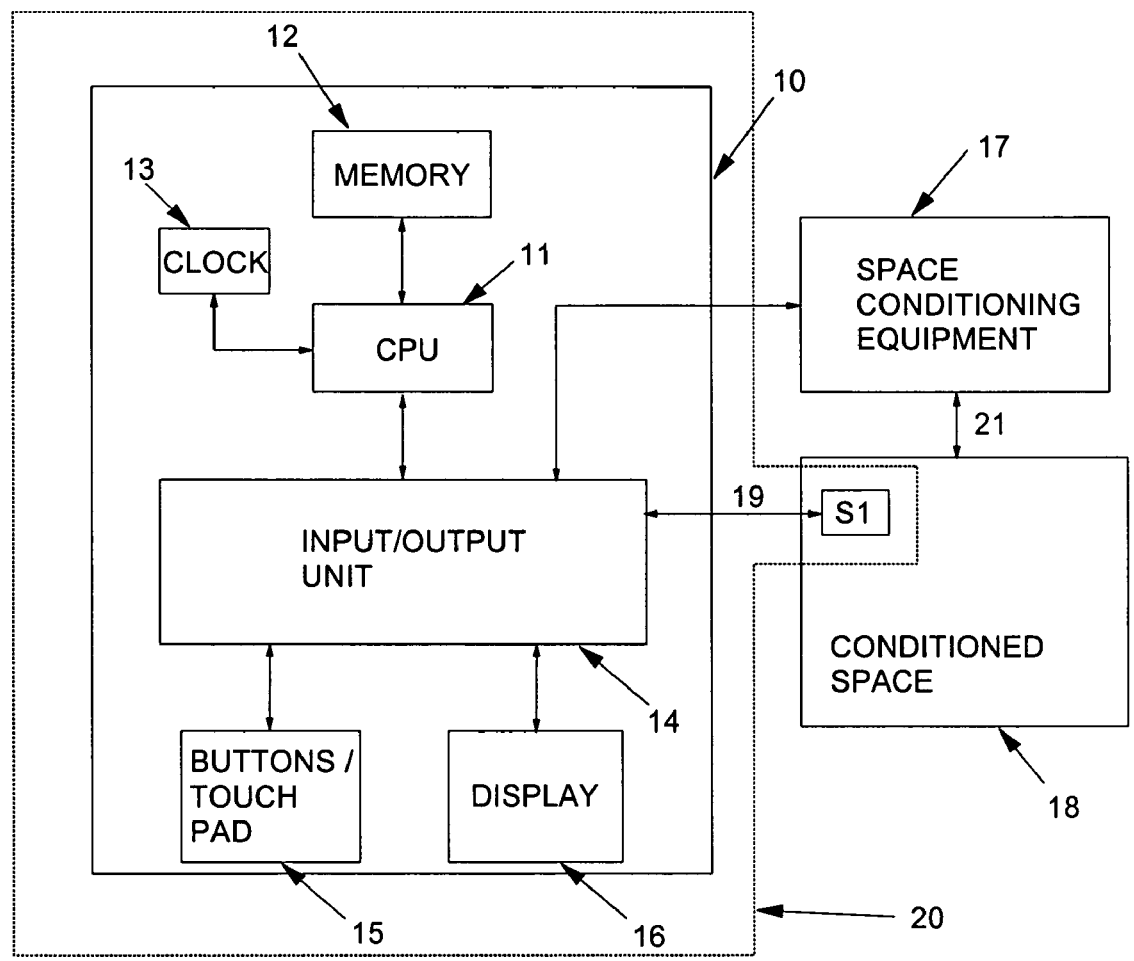
FIG. 1 is block diagram of the thermostat system.

The invention is now discussed with reference to the figures.

Referring now to FIG. 1, central control device 13 is shown in a block diagram form with a processor 10 connected to an environmental temperature sensor S1 which are disposed with access to conditioned space 18. The processor 10 and the sensors S1 are be situated in a common housing 20, so that sensor S1 has effective access to the room in which the housing 20 for processor 10 is located.

The processor 10 includes a central processing unit (CPU) 11 in communication with a memory 12 which stores data and program information and also, via an input/output unit (I/O unit) 14, an optional user interface 15 and a liquid crystal or other type display (LCD) 16. The memory 12 may include a read-only part which is factory-programmed and a random-access part which stores data subject to change during operation. A settable real time clock 13 is used to keep time in the central control device to facilitate diverse operations, such as different temperature set points (desired temperatures), during different periods of the day cycle. The I/O unit 14 includes a communications interface 19 for coordinating communications between the CPU 11 and sensor S1. Sensor S1 is preferably a resistance temperature detector or thermistor comprising a resistance element and two lead wires from making electrical connection with the resistance element.

Thus, in the usual manner during normal operation, sensor S1 sends an electrical signal in the form of a resistance value representative of the temperature within its local conditioned space 18 which the processor use to calculate local ambient temperature to compare against a previously entered set point to determine if control signals need to be sent to the space conditioning equipment 17. For example, if the control value temperature in the conditioned space is found to be too low when operation is in the heating mode, the processor 31 signals the space conditioning equipment 18 circulate, through ducts 21, air from/to the conditioned space 18 which is heated by the space conditioning equipment before return to the conditioned space. This heating phase continues until the calculated control value indicates that the space is now too hot (or approaching too hot) with reference to the set point such that the processor 11 sends signal(s) to the space conditioning equipment 18 to cease the heating function, all as very well known in the art. In a cooling mode, a counterpart procedure is followed.

Consider now a prior art structure of a thermistor electrically and supportively connected with a circuit board as in FIG. 2. FIG. 2 represents a broken away section of a circuit board 31 as part of support means for electrical components of a programmable thermostat as described in FIG. 1. Again referring to FIG. 2, circuit board 31 is located within a thermostat housing (not shown) and effectively supports and connects electrical components typical for a programmable thermostat. A thermistor with a resistance element 30 is shown supported above a printed circuit board 31 by lead wires 33. Lower ends of lead wires 33 are surface mounted by solder connections 34 to plated solder pads 32. Plated solder pads 32 are connected with other electrical components by way of printed connections on circuit board 31. Lead wires 33 are formed from copper or other conductor. Solder pads 32, solder of soldered connections 34, and circuit board 31 similarly are formed from materials having relatively high heat transfer coefficients. The form of the prior art device in FIG. 2 permits a relatively high degree of heat transmission to resistance element 30 from circuit board 31.

FIG. 3 represents similar to that of FIG. 2, where invention thermal barrier wires 36 are shown intervening between lower soldered connections 38 on solder pads 32 and upper soldered connections 37. The lower connections 38 are at a level substantially below connections 37. In general, preferred embodiments of thermal barrier wires comprise relatively long sections of wire and/or a wire diameter as small as possible while still providing structural support. Non-ferrous wire diameter is often measured in AWG numerical values. Extending said wire lengths and/or reducing wire diameter for thermal barrier wires improves thermal isolation 36 in the present invention.

In a specific example of the invention, thermal barrier wires 36 provide a thermal isolation distance between an uppermost part of connections 38 and a lowermost part of connections 37 preferably less than 3 centimeters, more preferably less than about 2 centimeters, and most preferably less than about 1 centmeter. In another specific example of the invention, thermal barrier wires 36 comprise a wire diameter of preferably less than about 12 AWG, more preferably less than about 18 AWG, and most preferably less than about 24 AWG. A specific example of one effective composition of the thermal barrier wires is as follows: nickel and chrome alloys, which composition forms a highly effective bond with the solder of the soldered connections.

Inspection of the structure shown in FIG. 3 shows that resistance element 30 cannot receive conductive heat transfer from circuit board 31, solder plates 32, or soldered connections 38 (or contiguous other elements) unless said heat transfer passes through thermal barrier wires 36. The presence of thermal barrier wires 36 is sufficient to prevent resistance element 30 from receiving undesired amounts of heat transfer from other electrical components in the thermostat housing. It is true that some conductive heat transfer takes place through thermal barrier wires 36 to lead wires 33 and thereafter to resistance element 30 from other electrical components in the thermostat. However, the sensed temperature at resistance element 30 is not effectively different from that of the ambient air temperature even after such heat transfer to the resistance element 30 since the amount of heat transfer is insignificant.

The present invention may be practiced with any of several ambient temperature sensors. While resistive temperature sensors are widely used, others are well known in the art. Integrated silicon chip sensors are commercially available from many suppliers, including from Dallas Semiconductor Corp. (4401 South Beltwood Parkway, Dallas, Tex.; Product No. DS1624 "Digital Thermometer and Memory").

A further embodiment of the invention is now described where one or fewer than all required electrical connections to a temperature sensor include a section of thermal barrier wires. In this embodiment, an effective thermal isolation of a temperature sensor is provided between said sensor and a supporting surface, which can at times be heated to a temperature relatively higher than ambient air. A specific type of temperature sensor may require two electrical connections to a printed circuit board which becomes heated by connected components. In contrast to the above specific description, only one of the thermal barrier wires 36 is formed from material with low thermal conductivity. The other of the two thermal barrier wires is formed of prior art material such as copper. It is preferred in this embodiment that the thermal barrier wire 36 with low thermal conductivity provide most of the support of a supported temperature sensor. The other wire of the thermal barrier wires may have higher thermal conductivity and a relatively longer length and/or wire diameter as compared with the other, low heat conductive wire. In this construction, heat transfer along the higher heat conductive wire to the temperature sensor is made negligible, as is heat transfer along the lower heat conductive wire. In a more general description of this embodiment, a temperature sensor may comprise one or more electrical connections with a heated surface, where said one electrical connection or fewer than all said electrical connections include a section of wire with low thermal conductivity. Reducing the number of lower heat conductive wires in the electrical connections of a temperature sensor to a heated surface can obtain the objects of the invention while reducing manufacturing steps and cost.

Thermal conductivity of copper is relatively high at 385 $Wm^{-1}K^{\circ-1}$. In contrast, the following are thermal conductivities for some conductors useful for thermal barrier means:

| Conductor | Thermal Conductivity ($Wm^{-1}K^{\circ-1}$) |
| --- | --- |
| Tin | 67 |
| Antimony | 32 |
| Bismuth | 18 |
| Cadmium | 105 |
| Chromium | 111 |
| Hastelloy | 9 |
| Inconel | 14 |
| Titanium | 26 |
| Manganese | 7 |
| Nickel | 106 |
| Nichrome V | 24 |
| Iron | 67 |
| Platinum | 70 |
| Monel (65% wt nickel + copper alloy) | 34 |
| Copper (55% wt)/Nickel (45% wt) alloy | about 40–70 (estimate) |

It is well known that heat transfer coefficients are determined by dividing the thermal conductivity by a length scale to determine actual heat transfer for a specific condition.

The above design options will sometimes present the skilled designer with considerable and wide ranges from which to choose appropriate apparatus and method modifications for the above examples. However, the objects of the present invention will still be obtained by that skilled designer applying such design options in an appropriate manner.

I claim:

1. A central control device with enhanced thermal isolation of temperature sensing electrical components, comprising:
   (a) a housing containing support means and electrical components, said electrical components being supported on the support means and adapted for thermostatic control of environmental control equipment which in turn controls temperature of a conditioned space;
   (b) the electrical components further comprising a processor and a temperature sensor;
   (c) the temperature sensor being adapted to detect ambient air temperature in the conditioned space while being simultaneously supported on support means and electrically connected to and thermally isolated from other electrical components by a thermal barrier means; and
   (d) the processor including:
      1) a central processing unit;
      2) a real time clock;
      3) a memory coupled to said central processing unit for storing a central control program and data; and
      4) an input/output unit coupled to the central processing unit, to the environmental control equipment for issuing control signals thereto, and to a reception interface adapted to receive signals representing a temperature from the temperature sensor by way of the thermal barrier means.

2. The device of claim 1, wherein the thermal barrier means comprise one or more electrical connections between the temperature sensor and the support means.

3. The device of claim 2 wherein one or more said electrical connections comprise a low heat conductivity section.

4. The device of claim 3 wherein fewer than all of said electrical connections comprise only high heat conductivity sections.

5. The device of claim 4 wherein the one or more low heat conductivity sections provide substantially all the support for the temperature sensor away from the support means.

6. The device of claim 1 wherein low thermal conductivity sections are formed from of one or more of the group consisting of tin; antimony; bismuth; cadmium; chromium; hastelloy; inconel; titanium; manganese; nickel; and a nickel copper allow.

7. A programmable thermostat with enhanced thermal isolation of temperature sensing electrical components, comprising:
   (a) a thermostat housing containing support means and electrical components, said electrical components being supported on the support means and adapted for thermostatic control of environmental control equipment which in turn controls temperature of a conditioned space;
   (b) the electrical components further comprising a processor, a temperature sensor, and relays adapted to activate environmental control equipment;
   (c) the temperature sensor being adapted to detect ambient air temperature in the conditioned space while being simultaneously supported on support means and electrically connected to and thermally isolated from other electrical components by a thermal barrier means; and
   (d) the processor including:
      1) a central processing unit;
      2) a real time clock;
      3) a memory coupled to said central processing unit for storing a central control program and data; and
      4) an input/output unit coupled to the central processing unit, to the environmental control equipment for issuing control signals thereto, and to a reception interface adapted to receive signals representing a temperature from the temperature sensor by way of the thermal barrier means.

8. The device of claim 7 wherein the temperature sensor may comprise a resistive element or may comprise a solid state device for sensing temperature.

9. The device of claim 7 wherein thermal barrier means comprise one or more electrical connections having a low heat conductivity section.

10. The device of claim 9 wherein fewer than all of said electrical connections comprise only high heat conductivity sections.

11. The device of claim 10 wherein the one or more low heat conductivity sections provide substantially all the support for the temperature sensor away from the support means.

12. The device of claim 9 wherein low thermal conductivity sections are formed from of one or more of the group consisting of tin; antimony; bismuth; cadmium; chromium; hastelloy; inconel; titanium; manganese; nickel; and a nickel copper allow.

* * * * *